United States Patent
Bollu et al.

(10) Patent No.: US 7,619,924 B2
(45) Date of Patent: Nov. 17, 2009

(54) DEVICE AND METHOD FOR READING OUT MEMORY INFORMATION

(75) Inventors: Michael Bollu, Kirchheim (DE); Michael Bernhard Sommer, Raubling (DE)

(73) Assignee: Infineon Technologies AG (DE)

(*) Notice: Subject to any disclaimer, the term of this patent is extended or adjusted under 35 U.S.C. 154(b) by 254 days.

(21) Appl. No.: 11/846,914

(22) Filed: Aug. 29, 2007

(65) Prior Publication Data

US 2008/0056024 A1    Mar. 6, 2008

(30) Foreign Application Priority Data

Aug. 30, 2006    (DE) ................. 10 2006 040 571

(51) Int. Cl.
*G11C 7/00*    (2006.01)
(52) U.S. Cl. ............... 365/185.15; 365/189.07; 365/185.2; 365/185.21
(58) Field of Classification Search ........ 365/185, 365/15
See application file for complete search history.

(56) References Cited

U.S. PATENT DOCUMENTS

| | | | |
|---|---|---|---|
| 4,339,809 A * | 7/1982 | Stewart ................ | 365/206 |
| 5,995,421 A | 11/1999 | McKenny | |
| 6,052,307 A | 4/2000 | Huber et al. | |
| 7,446,549 B2 * | 11/2008 | Tomita et al. ............ | 324/763 |
| 2009/0073760 A1 * | 3/2009 | Betser et al. ............ | 365/185.2 |

FOREIGN PATENT DOCUMENTS

FR    2 814 583 A1    3/2002

* cited by examiner

*Primary Examiner*—Gene N. Auduong
(74) *Attorney, Agent, or Firm*—Dickstein, Shapiro, LLP.

(57) ABSTRACT

A device for reading out memory information storable in a memory has an integrator and a comparator. The memory provides, in a hold phase, a leakage current, and in a readout phase, a readout current. The readout current is dependent on the stored memory information. The integrator is adapted to integrate a quantity derived from the leakage current during the hold phase, and to provide a leakage voltage corresponding to an integrated leakage current. The integrator is further adapted to integrate a quantity derived from the readout current during the readout phase, and to provide a readout voltage corresponding to an integrated readout current. The comparator may compare the leakage voltage to the readout voltage and provide, in dependence on the comparison, a readout value corresponding to the memory information.

25 Claims, 6 Drawing Sheets

DEVICE AND METHOD FOR READING OUT MEMORY INFORMATION

CROSS-REFERENCE TO RELATED APPLICATIONS

This application claims priority from German Patent Application No. 102006040571.4, which was filed on Aug. 30, 2006, and is incorporated herein in its entirety by reference.

TECHNICAL FIELD

The present invention relates to a device and a method for reading out memory information storable in a memory.

BACKGROUND

The technical realization of reading out a memory, for example a non-volatile memory, necessitates solving several technical problems. There are several criteria to be met.

For one thing it is important that a circuit suitable for reading out the memory be designed in the cost-effective manner. This means that the silicon area necessary for the realization of the circuit is to be kept small. Furthermore, it is necessary to read out the cell as fast as possible at low current consumption. The access time for the data of the non-volatile memory depends on the specification of the package containing the non-volatile memory. The package may for example be a chip card. In a chip card, the access time of the card is substantially determined by the time of reading out the memory cell itself. Here, a NOR flash stands out compared to a NAND flash by means of its faster access time. Moreover, for a total chip containing a non-volatile memory, typically, a maximum current is prescribed in the specification. In addition, and in particular for a contactless chip card, maximum permitted current peaks are prescribed in the specification. The requirements given by the specification are broken down to all circuit parts and therefore also to a sense amplifier necessitated for reading out the memory. Here, the sense amplifier deserves special attention, as it substantially contributes to the peak current because of its frequency of occurrence.

For reading out the memory, an adaptive current readout method may be employed. Specifically in a non-volatile memory, information to be stored may be stored in the form of a starting voltage variation of a selection transistor. The starting voltage varying of for example an N-FET also means, however, that an "ON" and "OFF" current of the selection transistor changes or defines at the same enabling voltage. As in a memory consisting of several memory cells, only ever one memory source per bit line or sense line, respectively, is enabled, and all other cells of the same bit line or sense line are non-conducting, that is "OFF", the "OFF" current is dependent on the programming of the cells also connected to the bit line. Reading out a cell signal is dependent on the programming of the cells not to be read out because of the "OFF" current of the cells not to be read out. This factor results in the necessity of adaptive reading out. This means that the states, that is the current flows, of the memory cells before and after the enabling must be compared to each other. For example, the "OFF" current prior to the enabling may be compared to the assumed "ON" current after the enabling. This means that, at a given word line voltage, opening the transistor will not take place and the resistor therefore gates off (is turned off). If the current has substantially increased after the enabling, then the enabling voltage will have sufficed to open the cell in the form of the selection transistor. Therefore, the starting voltage of the cell is lower than the word line voltage and/or the enabling voltage. In order to retrieve the memory information stored in the memory cell, the "OFF" current is stored by means of a programmable current source prior to the enabling and compared to the "ON" current after the enabling.

SUMMARY

According to an embodiment, a device for reading out memory information storable in a memory, wherein by the memory, in a hold phase, a leakage current, and in a readout phase, a readout current dependent on the memory information is providable, may have: a capacitance having a first terminal connected to an output of the memory so as to receive a quantity derived from the leakage current and the readout current, wherein a leakage voltage corresponds to a voltage dropping at the capacitance at the end of the hold phase, and a readout voltage corresponds to a voltage dropping at the capacitance at the end of the readout phase; and a comparison circuit having a first input connectable to the terminal of the capacitance so as to acquire a first voltage corresponding to the leakage voltage, having a second input connectable to the terminal of the capacitance so as to acquire a second voltage corresponding to the reading voltage, and having an output configured to output a readout value corresponding to the memory information, dependent on a comparison of the first voltage with the second voltage.

According to another embodiment, a memory device may have: a memory configured to store memory information; and a device configured to read out memory information storable in a memory, wherein by the memory, in a hold phase, a leakage current, and in a readout phase, a readout current dependent on the memory information is providable, having: a capacitance having a first terminal connected to an output of the memory so as to receive a quantity derived from the leakage current and the readout current, wherein a leakage voltage corresponds to a voltage dropping at the capacitance at the end of the hold phase, and a readout voltage corresponds to a voltage dropping at the capacitance at the end of the readout phase; and a comparison circuit having a first input connectable to the terminal of the capacitance so as to acquire a first voltage corresponding to the leakage voltage, having a second input connectable to the terminal of the capacitance so as to acquire a second voltage corresponding to the reading voltage, and having an output configured to output a readout value corresponding to the memory information, dependent on a comparison of the first voltage with the second voltage.

According to another embodiment, a device for reading out memory information storable in a memory, wherein by the memory, in a hold phase, a leakage current, and in a readout phase, a readout current dependent on the memory information is providable, may have: a capacitance having a first terminal connected to an output of the memory so as to receive the leakage current and the readout current, wherein a leakage voltage corresponds to a voltage dropping at the capacitance at the end of the hold phase and a readout voltage corresponds to a voltage dropping at the capacitance at the end of the readout phase; a memory capacitance having a first terminal and a second terminal, the first terminal connectable to the terminal of the capacitance so as to acquire a first voltage corresponding to the leakage voltage; a booster having an output connectable to the second terminal of the memory capacitance so as to impart the first voltage with an offset voltage; and a comparison circuit having a first input connectable to the first terminal of the memory capacitance so as to acquire the first voltage, having a second input connectable to the terminal of the capacitance, so as to acquire a second voltage corresponding to the reading voltage, and having an output configured to output a readout value corresponding to the memory information, dependent on a comparison of the first voltage with the second voltage.

According to another embodiment, a device for reading out memory information storable in a memory, wherein by the memory, in a hold phase, a leakage current, and in a readout phase, a readout current dependent on the memory information is providable, may have: an integrator configured to integrate a first quantity derived from the leakage current during the hold phase, and to provide a leakage voltage corresponding to an integrated leakage current, and to integrate a second quantity derived from the readout current during the readout phase, and to provide a readout voltage corresponding to an integrated readout current; and a comparator configured to provide a readout value corresponding to the memory information, dependent on the leakage voltage and the readout voltage.

According to another embodiment, a method for reading out memory information storable in a memory, wherein by the memory, in a hold phase, a leakage current, and in a readout phase, a readout current dependent on the memory information is providable, may include: integrating the leakage current during the hold phase and providing a leakage voltage corresponding to an integrated leakage current, and integrating the readout current during the readout phase and providing a readout voltage corresponding to an integrated readout current; and comparing the leakage voltage to the readout voltage and providing a readout value corresponding to the memory information, dependent on the comparison result.

BRIEF DESCRIPTION OF THE DRAWINGS

Embodiments of the present invention will be detailed subsequently referring to the appended drawings, in which.

DETAILED DESCRIPTION

In the following description of the embodiments of the present invention, like or similar reference numerals are used for the elements represented in the various drawings and having a similar effect, wherein a repeated description of these elements is omitted.

Figure 1:
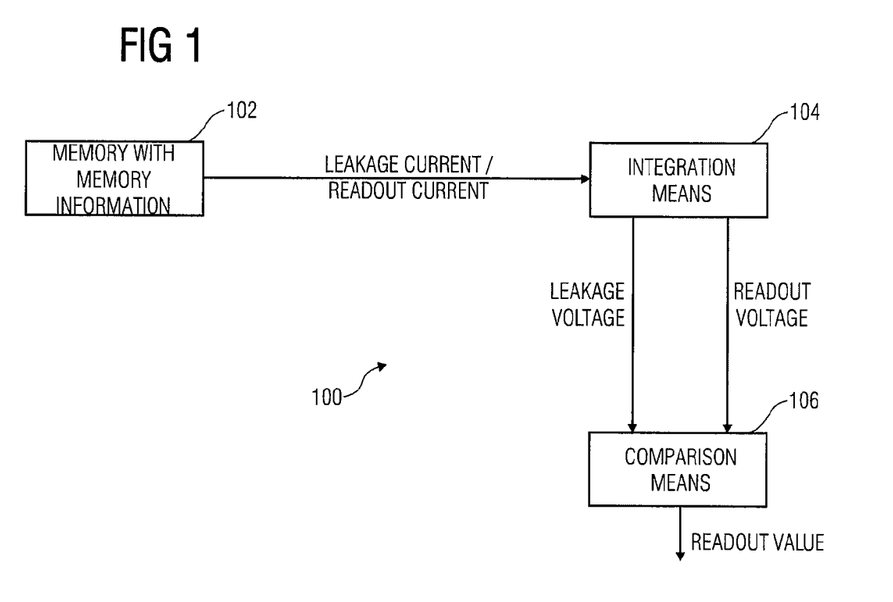
FIG. 1 is a block diagram of a device according to an embodiment of the present invention.

FIG. 1 shows a block diagram of a device 100 for reading out memory information. The memory information may be stored in a memory 102. The device 100 comprises integration means 104 and comparison means 106.

The memory 102 may be configured to provide an "OFF" current and in an "OFF" phase. In the following, the "OFF" phase is referred to as the hold phase and the "OFF" current is referred to as the leakage current. In the hold phase, the memory 102 is not enabled. That is, the memory information stored in the memory 102 is retained in the memory 102 but not read out. In the "ON" phase, the memory 102 is enabled so as to read out the memory information stored in the memory 102. The memory 102 may be configured to provide an "ON" current in the "ON" phase. In the following, the "ON" phase is referred to as the readout phase and the "ON" current is referred to as the readout current. Therefore, the hold phase defines a period in which the memory information is not read out of the memory. Compared to that, the readout phase defines the period in which the memory information is read out of the memory 102. The magnitude of the readout current depends on the memory information stored in memory 102. For example, the readout current may assume a high current intensity when a logic 1 is stored in the memory 102, and a low current intensity, when a logic 0 is stored in the memory 102. If the readout current reaches a high current intensity, same differs from a current intensity of the leakage current. The current intensity of the leakage current approximately corresponds to the low current intensity of the readout current.

The integration means 104 is configured to receive and integrate the leakage current and/or readout current provided by the memory 102 and/or receive and integrate a quantity derived from the leakage current and the readout current. For this purpose, the integration means 104 is configured to integrate the leakage current in the hold phase and the readout current in the readout phase. Alternatively, the integration means 104 may be configured to integrate the quantity derived from the leakage current and/or the quantity derived from the readout current. The integration means 104 is any means suitable for integrating or summing up a current and providing an integration value corresponding to the integrated current. Alternatively, the integration means 104 may be any means suitable for evaluating a quantity derived from a current and providing the integration value corresponding to the integrated current. The derived quantity may be a quantity corresponding to the leakage current and/or the readout current or a quantity proportional to the leakage current and/or the readout current. A quantity proportional to the leakage current and/or the readout current may for example be generated by means of a resistor at which the leakage current and/or readout current drops, or by means of a current mirror reflecting the leakage current and/or the readout current. According to this embodiment, the integration means 104 is configured to provide a leakage voltage and a readout voltage. The leakage voltage corresponds to the leakage current integrated during the hold phase, and the readout voltage corresponds to a readout current integrated during the readout phase. From the quantity of the leakage voltage as well as the quantity of the readout voltage, one can infer to both the quantity of the leakage current and the quantity of the readout current.

The comparison means 106 is configured to compare the values corresponding to the integrated leakage current and/or the integrated readout current. According to this embodiment, the comparison means 106 is configured to receive the leakage voltage as well as the readout voltage provided by the integration means 104 and compare them to each other. Depending on the comparison result yielded from a comparison of the quantities of the leakage voltage and the readout voltage, the comparison means 106 provides a readout value. From the provided readout value, one can inter to the memory information stored in the memory 102. If the comparison of the readout voltage and the leakage voltage shows that the readout voltage is greater than the leakage voltage, then memory information affecting a large readout current is stored in the memory 102. If the comparison result, however, shows that the leakage voltage is greater than or almost equal to the readout voltage, then memory information affecting a low readout current is stored in the memory 102. As will be explained in the following, taking additional measures may achieve the leakage voltage being greater than the readout voltage in the case of the low readout current so that a safe comparison result is guaranteed and the memory information may be determined unambiguously by a comparison of the leakage voltage with the readout voltage.

Thus, according to the inventive approach, the memory information is recovered by a comparison of two voltages and not by a direct comparison of leakage current and readout current. The inventive approach is advantageous in that the leakage voltage and the readout voltage may be latched for the comparison purposes using simple means. For this purpose, for example, parasitic capacitances that are present anyway may be used. No additional means is necessitated for the latching of currents. This simplifies the circuit structure, reduces chip area necessitated and therefore facilitates a saving of costs. In addition, current consumption may be substantially reduced as an integration of the leakage current and/or the readout current only is necessitated. If the integration is performed by means of a capacitance, only one current flow sufficient for charging the capacitance is necessary. Further current sources for performing the comparison are not necessitated as, according to the present invention, the comparison is based on a comparison of stored voltages. Therefore, current peaks may be avoided by the inventive approach.

Figure 2:
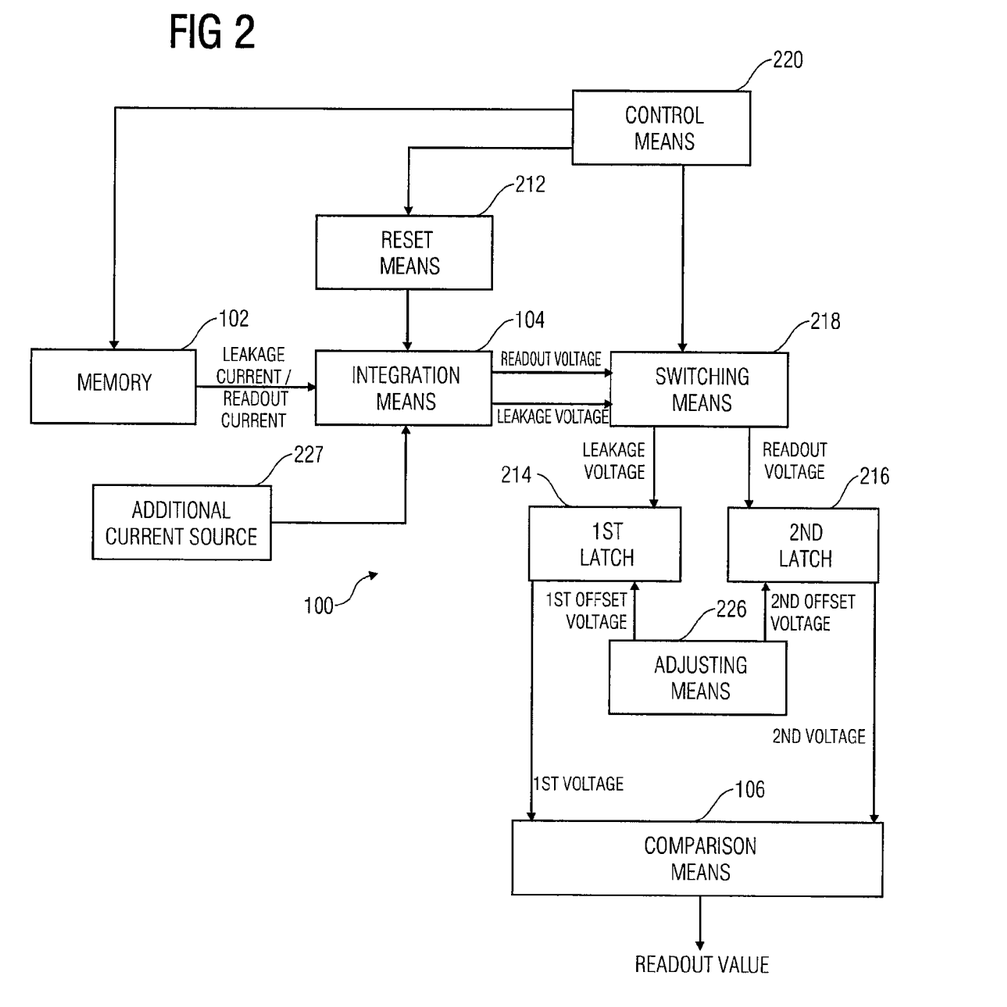
FIG. 2 is a block diagram of a device according to a further embodiment of the present invention.

FIG. 2 shows a block diagram of a further embodiment of a device 100 for reading out memory information stored in a memory 102. Again, the device 100 comprises the memory 102, the integration means 104, as well as the comparison means 106, which have already been described with respect to FIG. 1.

As FIG. 2 shows, the device 100 may additionally comprise a reset means 212, a first latch 214, a second memory storage 216, switching means 218, control means 220, adjusting means 226, and an additional current source 227. The device 100 may comprise all additional features shown in FIG. 2 or only combinations of individual ones of these additional features.

The latches 214, 216 are suitable for latching the leakage voltage as well as the readout voltage. Thereby, comparing the leakage voltage to the readout voltage may be simplified. According to this embodiment, the first latch 214 is configured to latch the leakage voltage and provide a first voltage corresponding to the leakage voltage to the comparison means 106. Correspondingly, the second latch 216 is configured to latch the readout voltage and provide a second voltage corresponding to the readout voltage to the comparison means 106. Latches 214, 216 may be any means suitable for latching a voltage. For example, latches 214, 216 may be capacitances.

The switching means 218 is used to latch the readout voltage and leakage voltage provided by the integration means 104 in the latches 214, 216. Therefore, the switching means 218 may be configured to connect, at the end of the hold phase, an output of the integration means 104 to an input of the first latch 214 so that a value of the leakage voltage provided by the integration means 104 may be latched in the first latch 214. After latching the leakage voltage in the first latch 214, the switching means 218 may break the connection between the integration means 104 and the first latch 214. Correspondingly, the switching means 218 may be configured to connect, towards the end of the readout phase, an output of the integration means 104 to an input of the second latch 216 so as to latch the readout voltage provided by the integration means 104 in the second latch 216. After latching the readout voltage in the second latch 216, the switching means 218 may again be configured to break the connection between the integration means 104 and the second latch 216.

According to an alternative embodiment, if the readout voltage and the leakage voltage are provided by the integration means 104 one after the other, one of the latches 214, 216 may be omitted if the voltage provided first by the integration means 104 is stored in the latch and the comparison means 106 is configured to perform a direct comparison of the latched voltage with the voltage provided by the integration means 104 next.

The reset means 212 may be configured to reset the integration means 104 before the hold phase and/or the readout phase begins or after the hold phase and/or the readout phase has been completed. This way, it may be guaranteed that the leakage voltage and/or readout voltage provided by the integration means 104 is not corrupted by influences having occurred prior to the respective integrations of the leakage current and/or readout current. If the integration means 104 is a capacitance, then the reset means 212 may be configured to discharge the capacitance at the beginning of each integration process.

The control means 220 may be configured to control the memory 102, the reset means 212 and the switching means 218. The control means 220 may for example be configured to enable the memory 102 so as to facilitate reading out the memory information. Correspondingly, the control means 220 may be configured to disable the memory 102. Furthermore, the control means 220 may be configured to control the reset means 212. Controlling the reset means 212 may for example initiate a beginning of the hold phase by briefly resetting the integration means 104. An end of the hold phase may be defined by the switching means 218 coupling the integration means 104 to the first latch 214 so as to latch the leakage voltage in the first latch 214. For this purpose, the switching means 218 may in turn be controlled by the control means 220. A beginning of the readout phase may be initiated by the control means 220 enabling the memory 102 so as to read out the memory information and in addition briefly enabling the reset means 213 so as to reset the integration means 104. An end of the readout phase may in turn be defined by the switching means 218 coupling the integration means 104 to the second latch 216 so as to latch the readout voltage in the second latch 216. The reset means 212 may be configured to briefly reset the integration means or keep the integration means in a reset state for a longer period, respectively. Alternatively, the reset means 212 may also be configured to reset the latches 214, 216 as and when necessitated. The switching means 218 may also be configured to either only briefly connect the integration means 104 to the latches 214, 216 or maintaining the connection over a longer period, for example the entire duration of the hold phase and/or the readout phase.

Depending on the configuration of the memory 102 as well as the device 100, it may be necessary to perform a correction of the leakage current and/or the readout current or a correction of the voltages to be compared in the comparison means 106. This may for example be necessitated if the quantity of the leakage current approximately corresponds to the quantity of the low readout current, or if the low readout current is greater than the leakage current. In order to ensure that the comparison means 106 provides a readout value that corresponds to the memory information, it may therefore be necessary to raise and/or lower the leakage current and/or readout current, the leakage voltage and/or readout voltage or the first voltage and/or second voltage by additional means. The leakage current and/or readout current may for example be modeled by means of the additional current source 227. For this purpose, the additional current source 227 may feed an additional current directly to a connection line between the memory 102 and the integration means 104 or else to an additional input of the integration means 227. The additional current source 227 may also be controlled by the control means 220 so that it is active only during the hold phase or only during the readout phase, respectively.

Alternatively, the size of the readout voltage and/or leakage voltage may be corrected via the integration durations, in which the integration means 104 integrates the leakage current and/or the readout current. The control means 220 may for example be configured to control the beginning and the end of the hold phase as well as the beginning and the end of the readout phase such that the time duration of the hold phase is longer than the time duration of the readout phase, or vice versa. Alternatively, the first voltage and/or the second voltage may be corrected by imparting the latches 214, 216 with an additional offset voltage by means of the adjusting means 226. Thus, the adjusting means 226 may be configured to impart the first latch 214 with a first offset voltage and the second latch 216 with a second offset voltage. If the offset voltages are different voltages and/or if only one of the latches 214, 216 is imparted with an additional offset voltage, the first and/or second voltage may be corrected for as necessitated. Alternatively, the latches 214, 216 may be differently configured, so that a correction of the latched voltages is yielded.

The readout value corresponding to the stored memory information may be a digital value, an analog voltage, or an analog current facilitating a reliable inference to the stored memory information.

Figure 3:
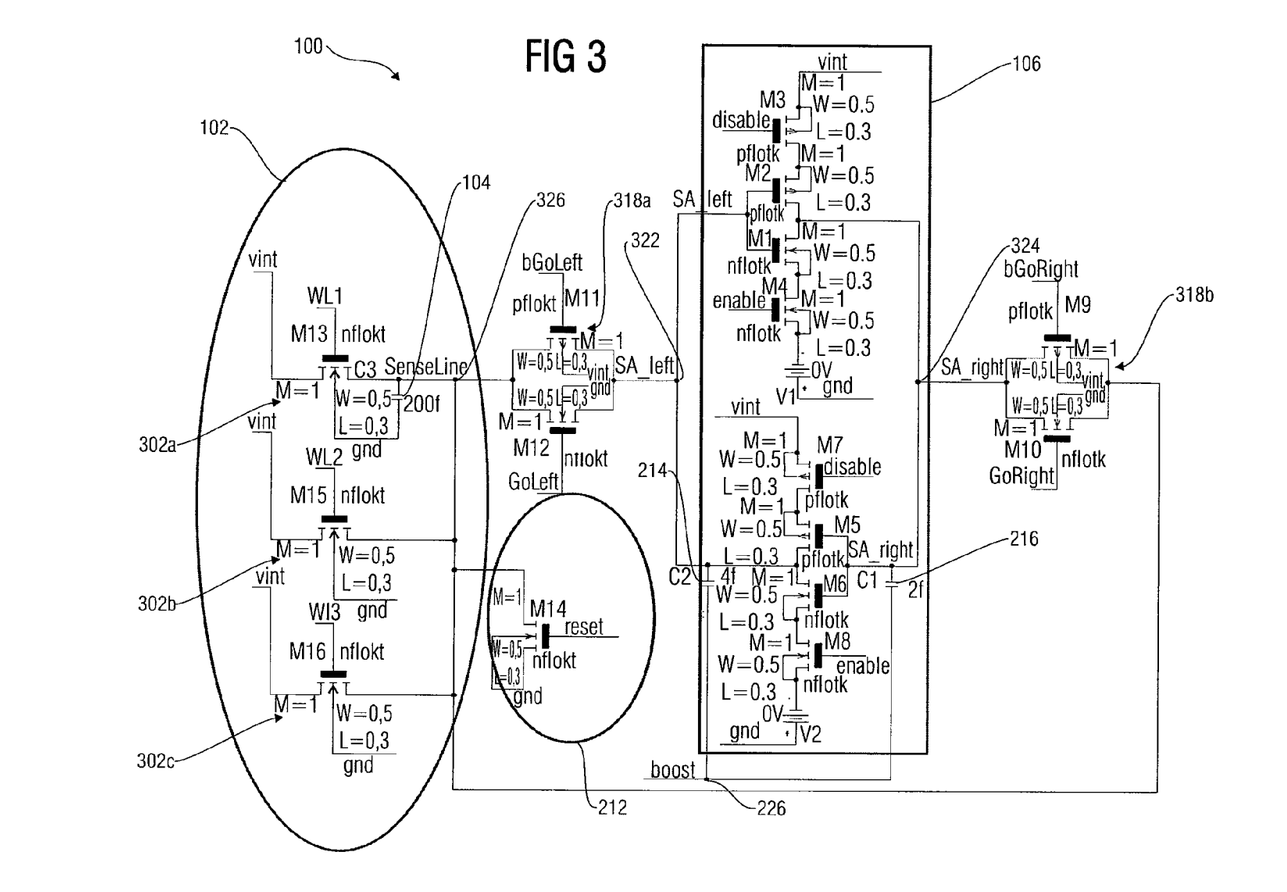
FIG. 3 is a transistor circuit of a device according to a further embodiment of the present invention.

FIG. 3 shows a transistor circuit of a device 100 according to a further embodiment of the present invention. The device may be an adaptive sense amplifier. The device 100 comprises a memory 102, integration means 104 and comparison means 106. Furthermore, the device 100 comprises reset means 212, a first latch 214, a second latch 216 and switching means consisting of circuits 318a and 318b, as well as adjusting means 226. The memory 102 comprises three memory cells 302a, 302b, 302c. The comparison means 106 comprises inputs 322, 324. At the inputs 322, 324 the readout value may also be read off. Furthermore, the memory 102 has an output 326.

A memory cell, for example the memory cell 302a, comprises a transistor, for example an N-FET. The transistor is connected at its input side to a supply voltage potential vint and at its output side to the output 326 of the memory 102. A control input of the transistor is connected to a readout line, for example a word line VL1. The memory cell 302a may be a non-volatile memory cell, wherein the memory information is stored by varying the starting voltage of the transistor. This means that the transistor either gates off (is turned off) or gates (is turned on) during the readout, that is with the readout line VL1 being enabled, in accordance with the stored memory information. If the transistor gates off, only a small readout current will flow at the output 326 of the memory 102. If the transistor gates, however, a large readout current will flow at the output 326. As long as the readout line VL1 is not enabled, the transistor will also gate off. There will, however, still be a small leakage current flowing. Correspondingly, the memory cells 302b, 302c, which can each be controlled by own readout lines 302b, 302c, are configured. The outputs of the memory cells 302a, 302b, 302c may be connected to one another, so that the readout current of one of the memory cells 302a, 302b, 302c superimposes the leakage currents of those memory cells 302a, 302b, 302c that are currently not read out.

The structure and number of the memory cells 302a, 302b, 302c is only exemplary. Alternatively, the memory 102 may have another arrangement of memory cells providing different readout currents, depending on the memory information stored.

The integration means 104 of the embodiment shown in FIG. 3 is a capacitance C3, which is connected between the output 326 of the memory 102 and a ground potential gnd. The capacitance C3 may be a parasitic capacitance, for example of the memory cell 302a.

According to the embodiment shown in FIG. 3, the reset means 212 has a transistor M14. The transistor may be an N-FET. The transistor is connected between the output 326 of the memory 102 and the ground potential gnd and is controlled via a reset line reset. Therefore, the transistor establishes a connection between the output 326 and the ground potential when the reset line is enabled. This causes the capacitance C3 of the integration means 104 to be discharged. In addition, in the case that the switching means 318a, 318b establish a connection to the latches 214, 216, the latches 214, 216 in the form of further capacitances C1, C2 may be discharged.

The switching means 318a, 318b may be realized as transistor circuits. The switching circuit 318a has two transistors M11, M12, the inputs thereof each being connected to the output 326 of the memory 102. The outputs of both transistors are connected to the first input 322 of the comparison means 106. The transistor M11 may be a P-FET, and the transistor M12 may be an N-FET. The transistors are controlled by the switching signals GoLeft, bGoLeft. Enabling the transistors via the switching lines causes the transistors to gate and therefore provide a connection between the output 326 of the memory 102 and the first input 322 of the comparison means 106. In the opposite case, the transistors gate off and therefore break the connection between the output 326 and the input 322. The structure and functioning of the second switching means 318b correspond to those of the first switching means 318a. Correspondingly, the transistors of the second switching means 318b are controlled via switching lines bGoRight, GoRight. Thereby, the second switching means 318b may connect the output 326 of the memory 102 to the second input 324 of the comparison means 106 or disconnect same therefrom. The output 326 of the memory 102 is connected to the switching means 318a, 318b as well as the reset means 212 via a line referred to as SenseLine.

The latches 214, 216 are each configured as a capacitances C2, C1. The capacitances C1, C2 may be parasitic capacitances. The capacitance C1 is connected between the first input 322 of comparison means 106 and an output of the adjusting means 226. Correspondingly, the capacitance C1 is connected between the second input 324 of the comparison means 106 and the output of the adjusting means 226.

The adjusting means 226, shown here as a line boost, may be configured to impart the capacitances C1, C2 with an offset voltage. According to the embodiment shown in FIG. 3, the capacitance C1, C2 may be imparted with the same offset voltage. Alternatively, the capacitance C1, C2 may be imparted with different offset voltages. This would necessitate two separate boost lines (not shown in FIG. 3).

The comparison means 106 may be realized as a transistor circuit having two feedback inverters. A first converter circuit is at its input side connected to the first input 322 and comprises the transistors M1, M2, M3, M4. The first inverter circuit is at its output side connected to the second input 324 of the comparison means 106, and is configured to pull, independently of a voltage applied to the first input 322, the second input 324 either to the supply voltage potential vint or to the ground potential gnd. The first inverter is connected to the output of the switching means 318a, a terminal of the capacitance C, as well as an output of the second inverter circuit via a line SA_left via the input 322. The second inverter circuit, consisting of the transistors M5, M6, M7 and M8, is constructed in accordance with the first transistor circuit and at its input side is connected to a terminal of the capacitance C1 via the line SA_right, and to the output of the second switching means 318b as well as the output of the first inverter circuit via the second input 324. In addition, both inverter circuits have inputs for the enabling signals enable, disable, which are connected to respective transistors M3, M4, M7, M8 of the inverter circuits.

The memory 102 may be a field of memory cells having a parasitic sense line capacitance C3 of 200 fF. The switching means 318a, 318b may be configured as transfer gates, and the reset means 212 may affect resetting or precharging the sense line. The comparison means 106 may be a sense amplifier.

The capacitances C1, C2 may be configured relatively equal. For example, the capacitance C1 may have a value of 2 fF, and the capacitance C2 may have a value of 4 fF. The transistors may be FET transistors of the quantities V=0.5 μm and L=0.3 μm. The latches 214, 216 may each be configured as boost capacitances, wherein boosting or charging the capacitance differently makes possible a recognition of a closed world line.

Ideally, the capacitances C1, C2 are of equal quantities. If one of the capacitances C1, C2 is boosted, the other one of the capacitances C1, C2 may be connected to ground gnd so that both inverter nodes 322, 324 have the same capacitive quantity.

The embodiments are exemplarily chosen and may be combined with one another. Specifically, the given quantities of the capacitances and transistors are exemplarily chosen and may be replaced by respective other circuit components.

According to the present invention, the problem of reading out a memory is solved by means of a voltage readout. As with current readout, with voltage readout, too, there are several phases necessitated for reading out memory information.

A first phase is a "reset" phase. It causes the sense line to be brought into a defined state such as 0V.

In a second phase, the leakage current is integrated via a parasitic line capacitance by means of a fixed time unit, a delay, and stored on one side of the sense amplifier. This may be affected by means of a parasitic capacitance. Thereby, the quantity of the leakage current was acquired for comparison at a given programming of a cell field.

A third phase is initiated after the access of the sense line to the sense amplifier was closed. In the third phase, the sense line is brought back to a defined state such as 0V. After this reset, the readout of a cell of the cell field may be started.

During a fourth phase, a world line the cell to be read out is allocated to be enabled. If the cell to be read out is programmed such that the cell transistor opens with the word line voltage applied, a substantially larger current will flow than will be the case in the second phase. Therefore, the sense line integrates a larger current and therefore more load during the same time. The result is a larger sense line voltage, which may be stored on the other side of the sense amplifier.

In a fifth phase, after both inputs of the amplifier were capacitatively precharged, the sense amplifier may be brought to its optimized operating point. The input nodes of the sense amplifier are capacitatively boosted to a more favorable working point. In order to ensure that the correct datum may be read out even in the case of a selection transistor programmed to gate off, slightly more voltage potential may be given to the input nodes by means of the leakage current bias. This may be affected by unequal boosting during the boosting to the operating point. A further possibility is that of artificially increasing the leakage current measured in the second phase by means of a small current source. The increase in leakage current may, however, not be larger than the readout cell current. It must, however, be larger than the increase in the leakage current of the selection transistor, based on the increased word line voltage. After the boost process, the sense amplifier may be enabled. The boost process may be made obsolete by precisely timed integration time, word line voltage and capacitive quantity of the input nodes of the sense amplifier or by an "artificial" leakage current.

In a sixth phase, the actual sense amplifier takes action. The sense amplifier may be, as shown below, a simple latch with two inverters that are fed back relative to each other. A supply voltage of the inverters is switched on not before both sides have capacitatively stored the desired information. However, a conventional operational amplifier that may be switched on is also conceivable. After this phase, the analog cell information is converted to a logic voltage value such as "0" or "1".

Therefore, the core of the invention is one and/or two time-fixed integrations by means of a parasitic capacitance via a leakage current before the enabling of the cell and a cell current after the enabling of the cell, and the comparison thereof. The integration of the currents via the time converts the current to a voltage. The two voltages resulting therefrom are briefly stored so as to be compared to each other after their generation has been completed.

Figure 4:
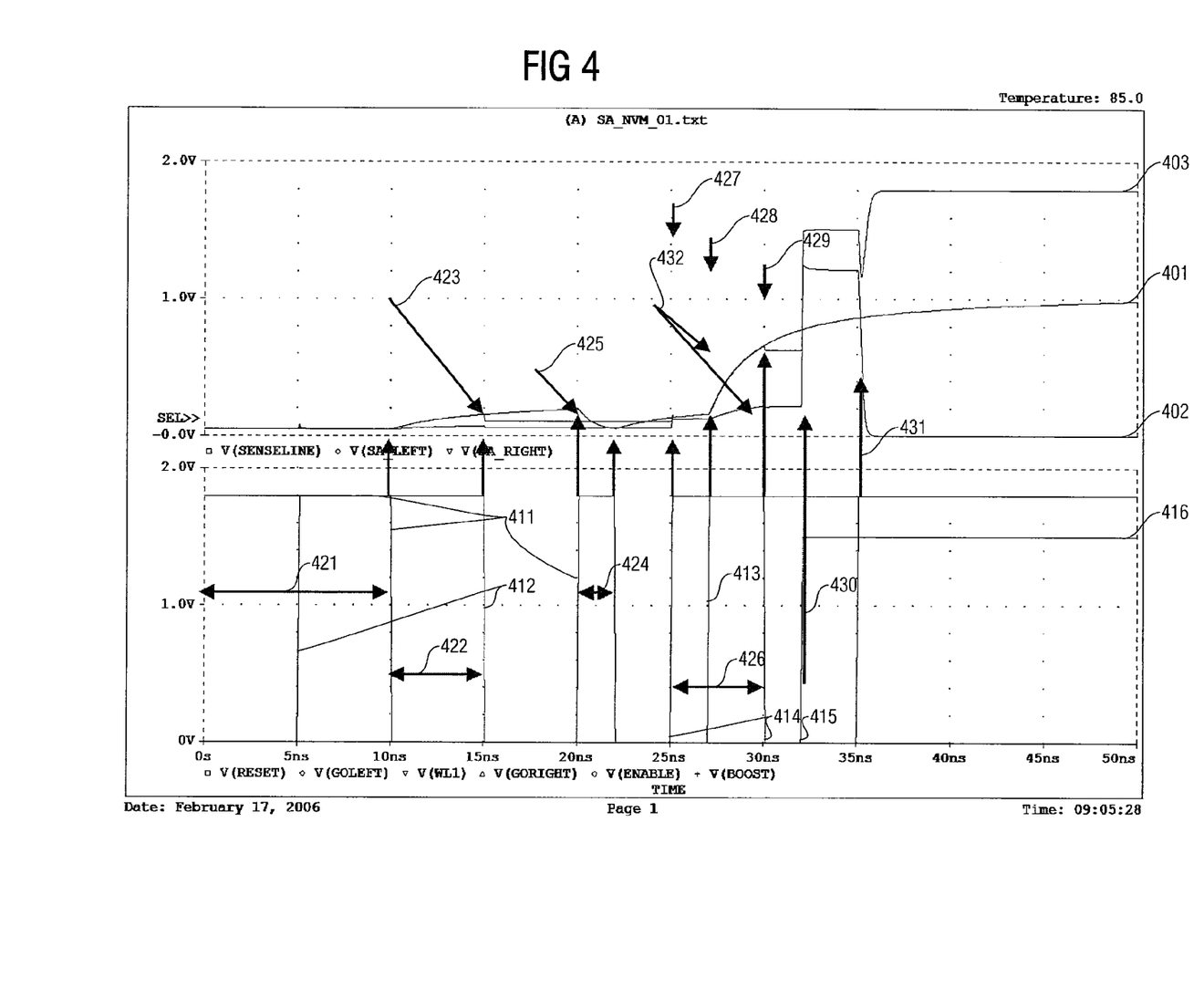
FIGS. 4 to 6 are graphic representations of voltage forms according to further embodiments of the present invention.
Figure 5:
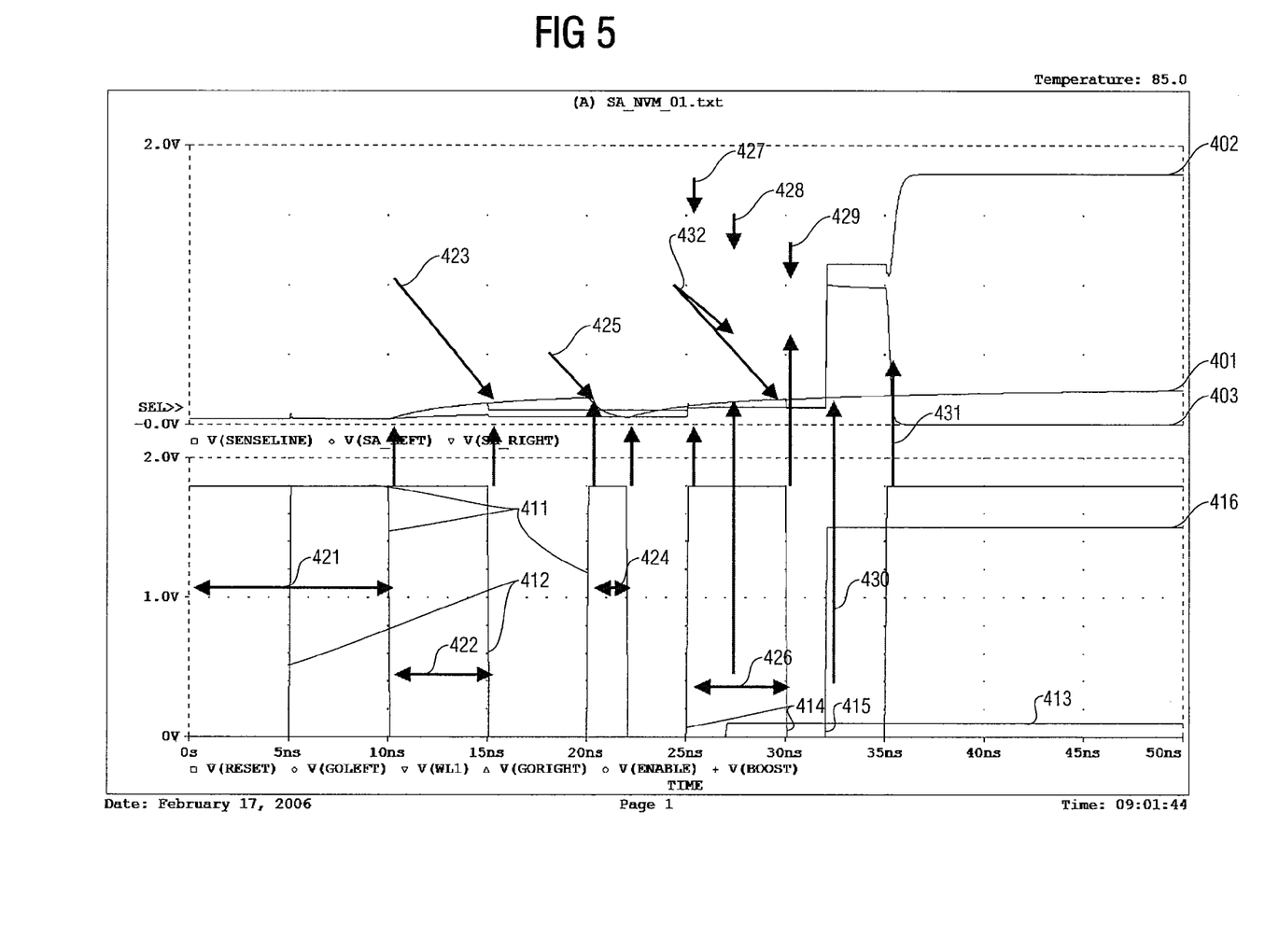

In FIGS. 4 and 5, the described phases 1 to 5 for reading out the memory information are graphically illustrated. In the upper sections of the FIGS. 4 and 5, the voltage values applied to the integration means and the latches are plotted, in relation to the transistor circuit in FIG. 3 that is the voltage V(SENSE-LINE) 401 of the sense line, the voltage V(SA_LEFT) 402 of the SA_left line, and the voltage V(SA_RIGHT) 403 of the SA_right line. In the lower sections of FIGS. 4 and 5, the voltages applied to the control lines reset, GoLeft, WL1, GoRight, enable and boost are shown, that is the voltages V(RESET) 412, V(GOLEFT) 412, V(WL1) 413, V(GORIGHT) 414, V(ENABLE) 415 and V(BOOST) 416. The voltages are plotted versus the time.

According to this embodiment, the first phase 421 has a time duration of 0 nanoseconds to 10 nanoseconds. In the first phase, a first reset and/or precharging of the sense line takes place. The second phase 422, also referred to as the hold phase, starts at the time 10 nanoseconds and lasts until the time 15 nanoseconds. In the second phase, the leakage current is read out. Towards the end 423 of the second phase at 15 nanoseconds, the leakage current information is stored on the left-hand side of the sense amplifier shown in FIG. 3. A capacitive coupling causes a drop at the voltage node. The third phase 424 starts at 20 nanoseconds and lasts until 22 nanoseconds. At the beginning 425 of the third phase, a reset and/or precharging of the sense line is carried out. The fourth phase 426 starts at 25 nanoseconds and lasts until 30 nanoseconds, in the fourth phase, also referred to as the readout phase, a readout of the leakage current as well as the cell signal takes place. At the beginning 427 of the fourth phase, a data transfer is started. At the time of 27 nanoseconds, there is an increase 428 in the word line voltage on the control line WL1. This starts the readout of the cell. With the end of the fourth phase, the data transfer is completed 429. In the fifth phase 430 at 32 nanoseconds, unequal boosting will take place. In a sixth phase 431 at 35 nanoseconds, the readout of the readout value takes place. The time spans as well as the voltage values shown and described in FIGS. 4 and 5 are chosen to be exemplary only. During the fourth phase 426, a capacitive coupling 432 within the amplifier (shown in FIG. 3) takes place.

In the embodiment shown in FIG. 4, the memory is programmed such that the word line voltage V(WL1) may open the selection transistor. In this case, the integration of the cell current V(SA_RIGHT) via the parasitic capacitance of the sense line V(SENSELINE) yields a higher potential than that of the leakage current V(SA_LEFT). The characteristic curve V(SA_RIGHT) experiences the logic state "1".

In contrast to that, FIG. 5 shows an embodiment in which the memory is programmed such that the word line voltage V(WL1) does not open the selection transistor. The integration of the field current V(SA_RIGHT) via the parasitic capacitance of the sense line V(SENSELINE) yields approximately the same potential as that of the leakage current V(SA_LEFT) after the transfer gate has been closed. The unequal boosting of the input nodes causes the voltage potential representing the leakage current to be significantly larger. The voltage line V(SA_RIGHT) experiences the logic state "1".

Figure 6:
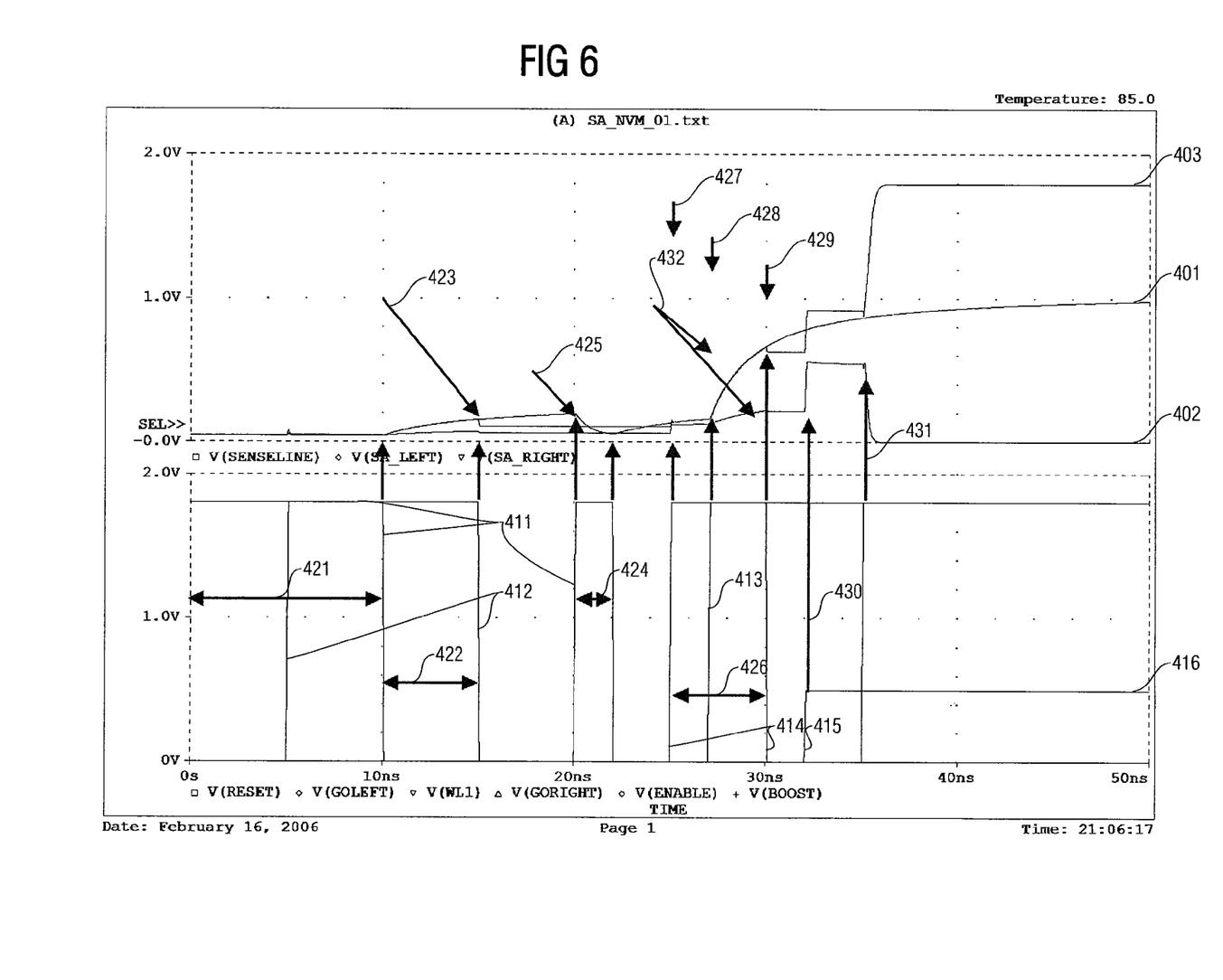

FIG. 6 shows a further graphic representation of the phases 1 to 5 for reading out the memory information.

Depending on the circumstances, the inventive method for reading out memory information may be implemented in hardware or in software. The implementation may be effected on a digital storage medium, in particular a floppy disk or a CD, with electronically readable control signals, which may cooperate with a programmable computer system such that the respective method is affected. In general, the invention therefore also consists in a computer program product with a program code for performing the inventive method stored on a machine-readable carrier when the computer program product runs on a computer. In other words, the invention may therefore also be realized as a computer program with a program code for performing the method when the computer program runs on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A device for reading out memory information storable in a memory, wherein by the memory, in a hold phase, a leakage current, and in a readout phase, a readout current dependent on the memory information is providable, comprising:
a capacitance comprising a first terminal connected to an output of the memory so as to receive a quantity derived from the leakage current and the readout current, wherein a leakage voltage corresponds to a voltage dropping at the capacitance at the end of the hold phase, and a readout voltage corresponds to a voltage dropping at the capacitance at the end of the readout phase; and
a comparison circuit comprising a first input connectable to the terminal of the capacitance so as to acquire a first voltage corresponding to the leakage voltage, comprising a second input connectable to the terminal of the capacitance so as to acquire a second voltage corresponding to the reading voltage, and comprising an output configured to output a readout value corresponding to the memory information, dependent on a comparison of the first voltage with the second voltage.

2. The device of claim 1, further comprising:
a first transistor circuit with a control input configured to receive a first control signal, a transistor input connected to the terminal of the capacitance, and a transistor output connected to the second input of the comparison circuit, and configured to supply the first voltage in dependence on the first control signal; and
a second transistor circuit with a control input configured to receive the second control signal, a transistor input connected to the terminal of the capacitance, and a transistor output connected to the first input of the comparison circuit, and configured to supply the second voltage in dependence on the second control signal.

3. The device of claim 1, further comprising a third transistor circuit with a transistor input connected to the terminal of the capacitance, a control input configured to receive a third control signal, and a transistor output configured to connect the terminal of the capacitance to a supply voltage potential, dependent on the third control signal.

4. The device of claim 1, further comprising a first booster with an output connected to the first input of the comparison circuit so as to impart the first input of the comparison circuit with a first offset voltage.

5. The device of claim 4, further comprising a first memory capacitance connected between the first input of the comparison circuit and the output of the first booster so as to store the first voltage.

6. The device of claim 1, further comprising a second booster with an output connected to the second input of the comparison circuit so as to impart the second input of the comparison circuit with a second offset voltage.

7. The device of claim 6, further comprising a second memory capacitance connected between the second input of the comparison circuit and the output of the second booster so as to store the second voltage.

8. The device of claim 1, wherein the capacitance is a parasitic capacitance between the output of the memory and a supply voltage potential.

9. The device of claim 1, wherein the comparison circuit comprises two inverter circuits fed back relative to each other, wherein an input of the first inverter circuit is connected to the first input of the comparison circuit, and wherein an input of the second inverter circuit is connected to the second input of the comparison circuit.

10. The device of claim 1, wherein the derived quantity corresponds to the leakage current and the readout current is proportional to the leakage current and the readout current.

11. A memory device comprising:
a memory configured to store memory information; and
a device configured to read out memory information storable in the memory, wherein by the memory, in a hold phase, a leakage current, and in a readout phase, a readout current dependent on the memory information is providable, comprising:
a capacitance comprising a first terminal connected to an output of the memory so as to receive a quantity derived from the leakage current and the readout current, wherein a leakage voltage corresponds to a voltage dropping at the capacitance at the end of the hold phase, and a readout voltage corresponds to a voltage dropping at the capacitance at the end of the readout phase; and
a comparison circuit comprising a first input connectable to the terminal of the capacitance so as to acquire a first voltage corresponding to the leakage voltage, comprising a second input connectable to the terminal of the capacitance so as to acquire a second voltage corresponding to the reading voltage, and comprising an output configured to output a readout value corresponding to the memory information, dependent on a comparison result of the first voltage with the second voltage.

12. The memory device of claim 11, wherein the memory comprises a first memory cell configured to store first memory information and a further memory cell configured to store further memory information; and wherein the leakage current results in the hold phase from a first leakage current of the first memory cell and a further leakage current of the further memory cell, and wherein in the readout phase, either the first memory cell or the further memory cell may be read out, and the reading current results from a sum of the read current of the memory cell to be read out and the leakage current of the respective other memory cell.

13. A device for reading out memory information storable in a memory, wherein by the memory, in a hold phase, a leakage current, and in a readout phase, a readout current dependent on the memory information is providable, comprising:

a capacitance comprising a first terminal connected to an output of the memory so as to receive the leakage current and the readout current, wherein a leakage voltage corresponds to a voltage dropping at the capacitance at the end of the hold phase and a readout voltage corresponds to a voltage dropping at the capacitance at the end of the readout phase;

a memory capacitance comprising a first terminal and a second terminal, the first terminal connectable to the terminal of the capacitance so as to acquire a first voltage corresponding to the leakage voltage;

a booster comprising an output connectable to the second terminal of the memory capacitance so as to impart the first voltage with an offset voltage; and a comparison circuit comprising a first input connectable to the first terminal of the memory capacitance so as to acquire the first voltage, comprising a second input connectable to the terminal of the capacitance, so as to acquire a second voltage corresponding to the reading voltage, and comprising an output configured to output a readout value corresponding to the memory information, dependent on a comparison of the first voltage with the second voltage.

14. A device for reading out memory information storable in a memory, wherein by the memory, in a hold phase, a leakage current, and in a readout phase, a readout current dependent on the memory information is providable, comprising:

an integrator configured to integrate a first quantity derived from the leakage current during the hold phase, and to provide a leakage voltage corresponding to an integrated leakage current, and to integrate a second quantity derived from the readout current during the readout phase, and to provide a readout voltage corresponding to an integrated readout current; and a comparator configured to provide a readout value corresponding to the memory information, dependent on the leakage voltage and the readout voltage.

15. The device of claim 14, further comprising:

a first latch configured to latch a first voltage corresponding to the leakage voltage; and a second latch configured to latch a second voltage corresponding to the readout voltage, wherein the comparison result may be determined in the comparator by comparing the first voltage to the second voltage.

16. The device of claim 15, further comprising a switch configured to couple the first latch to the integrator after completion of the hold phase so as to latch the first voltage, and to couple the second latch to the integrator after completion of the readout phase so as to latch the second voltage.

17. The device of claim 14, further comprising a resetter configured to reset the integrator at the beginning of each of the hold phase and the readout phase.

18. The device of claim 15, further comprising an adjuster configured to impart the first voltage with a first offset voltage and the second voltage with a second offset voltage.

19. The device of claim 17, further comprising a controller configured to control the resetter and the switch, wherein a time duration of the hold phase is determined to be a period of time between a first reset of the integrator and a latch of the first voltage, and wherein a time duration of the readout phase is determined to be a period of time between a second reset of the integrator and a latch of the second voltage.

20. The device of claim 18, wherein the resetter and the switch are controllable by the controller such that the time duration of the hold phase is longer than the time duration of the readout phase.

21. The device of claim 14, further comprising an additional current source configured to increase the leakage current during the hold phase.

22. The device of claim 14, wherein the integrator comprises a capacitance and the leakage voltage corresponds to a voltage dropping at the capacitance at the end of the hold phase, and the readout voltage corresponds to a voltage dropping at the capacitance at the end of the readout phase.

23. The device of claim 15, wherein the comparator comprises an amplifier circuit comprising a first input and a second input, and wherein the first voltage is providable at the first input by the first latch, and wherein the second voltage is providable at the second input by the second latch.

24. The device of claim 13, wherein the first derived quantity corresponds to the leakage current or is proportional to the leakage current, and wherein the second derived quantity corresponds to the readout current or is proportional to the readout current.

25. A method for reading out memory information storable in a memory, wherein by the memory, in a hold phase, a leakage current, and in a readout phase, a readout current dependent on the memory information is providable, comprising:

integrating the leakage current during the hold phase and providing a leakage voltage corresponding to an integrated leakage current, and integrating the readout current during the readout phase and providing a readout voltage corresponding to an integrated readout current; and comparing the leakage voltage to the readout voltage and providing a readout value corresponding to the memory information, dependent on the comparison result.

* * * * *